United States Patent [19]
Foreman

[11] 4,086,538
[45] Apr. 25, 1978

[54] GATED PULSE GENERATOR

[75] Inventor: Donald S. Foreman, Fridley, Minn.

[73] Assignee: Honeywell Inc., Minneapolis, Minn.

[21] Appl. No.: 644,670

[22] Filed: Dec. 29, 1975

[51] Int. Cl.² .............................................. H03K 5/20
[52] U.S. Cl. ................................... 328/112; 307/234;
307/362; 307/246; 307/264; 328/147
[58] Field of Search ............... 307/234, 235 N, 235 T,
307/246, 247 A, 260, 264, 265; 328/146, 147
111, 112

[56] References Cited
U.S. PATENT DOCUMENTS

| | | | |
|---|---|---|---|
| 3,448,296 | 6/1969 | Schwaninger | 307/235 T |
| 3,497,723 | 2/1970 | Nelson | 307/235 N |
| 3,693,101 | 9/1972 | Trimble | 328/147 |
| 3,800,234 | 3/1974 | Myren | 307/246 |
| 3,822,385 | 7/1974 | Kayalioglu | 307/234 |
| 3,860,833 | 1/1975 | Tyau | 307/247 A |
| 3,883,756 | 5/1975 | Dragon | 307/246 |
| 3,909,730 | 9/1975 | Odom | 307/234 |

OTHER PUBLICATIONS

"Pulse Width Discriminator", by Sellier in IBM Tech. Discl. Bulletin, vol. 17, No. 9, Feb. 1975, pp. 2648–2649.

Primary Examiner—Stanley D. Miller, Jr.
Attorney, Agent, or Firm—Alfred N. Feldman

[57] ABSTRACT

A gated pulse generator produces on output pulse for every period in which an input signal is continuously in a particular state for longer than a minimum gating interval. If the input signal changes state within the minimum gating interval, no output pulse is produced.

3 Claims, 3 Drawing Figures

GATED PULSE GENERATOR

REFERENCE TO CO-PENDING APPLICATION

Reference made to the U.S. Pat. No. 4,008,404 by Donald S. Foreman entitled "Interval Timer", which was filed on even date herewith and which is assigned to the same assignee as this application.

BACKGROUND OF THE INVENTION

The present invention relates to generation of pulses. In particular, the present invention is a gated pulse generator with minimum gating interval discrimination.

In recent years, considerable effort has been expended in the development of solid state electronic traffic controllers to replace the prior art electromechanical traffic controllers. The solid state controllers have the advantages of lower cost, smaller size, lower power consumption, and greater flexibility in functions performed than the prior art devices.

In the programmable solid state traffic controller described in the above-mentioned co-pending patent application, there is a need for a device which will produce output pulses to sequence the traffic signals at an intersection in response to an input signal. For the purpose of this discussion, the input signal has two states which will be designated logic "1" and logic "0". These designations are arbitrarily assigned and may be reversed without changing the operation of the system.

The gated pulse generator must meet several requirements. First, it must generate an output pulse if the input signal is "0" for greater than a certain time period (usually about 2 microseconds). The gated pulse generator must continue to generate pulses if the input signal stays at "0" for a longer period. In other words, the gated pulse generator must emit an output pulse for every period in which the input signal is continuously "0" for greater than 2 microseconds.

Second, if the input signal changes from "0" to "1" before the 2 microsecond period has elapsed, no output pulse must be produced. The pulse generation cycle is terminated without a pulse being produced. The gated pulse generator, therefore, has a minimum gating interval discrimination. This eliminates noise transients which may be present in the input signal.

Third, once an output pulse is started, it must continue for its full duration no matter what happens to the input signal. In other words, the gated pulse generator is insensitive to the state of the input signal once the output pulse begins.

SUMMARY OF THE INVENTION

The gated pulse generator of the present invention includes first, second, and third switching means and capacitor means. The first switching means produces an output pulse when a signal at its input terminal exceeds a threshold level. The capacitor means is connected to the input terminal of the first switching means. The second switching means discharges the capacitor means when its input signal is in a first input state and allows the capacitor means to charge when the input signal is in a second input state. The third switching means discharges the capacitor, thereby restarting the pulse generation cycle, when the first switching means produces an output pulse.

DETAILED DESCRIPTION OF THE PREFERRED EMBODIMENTS

Figure 1:
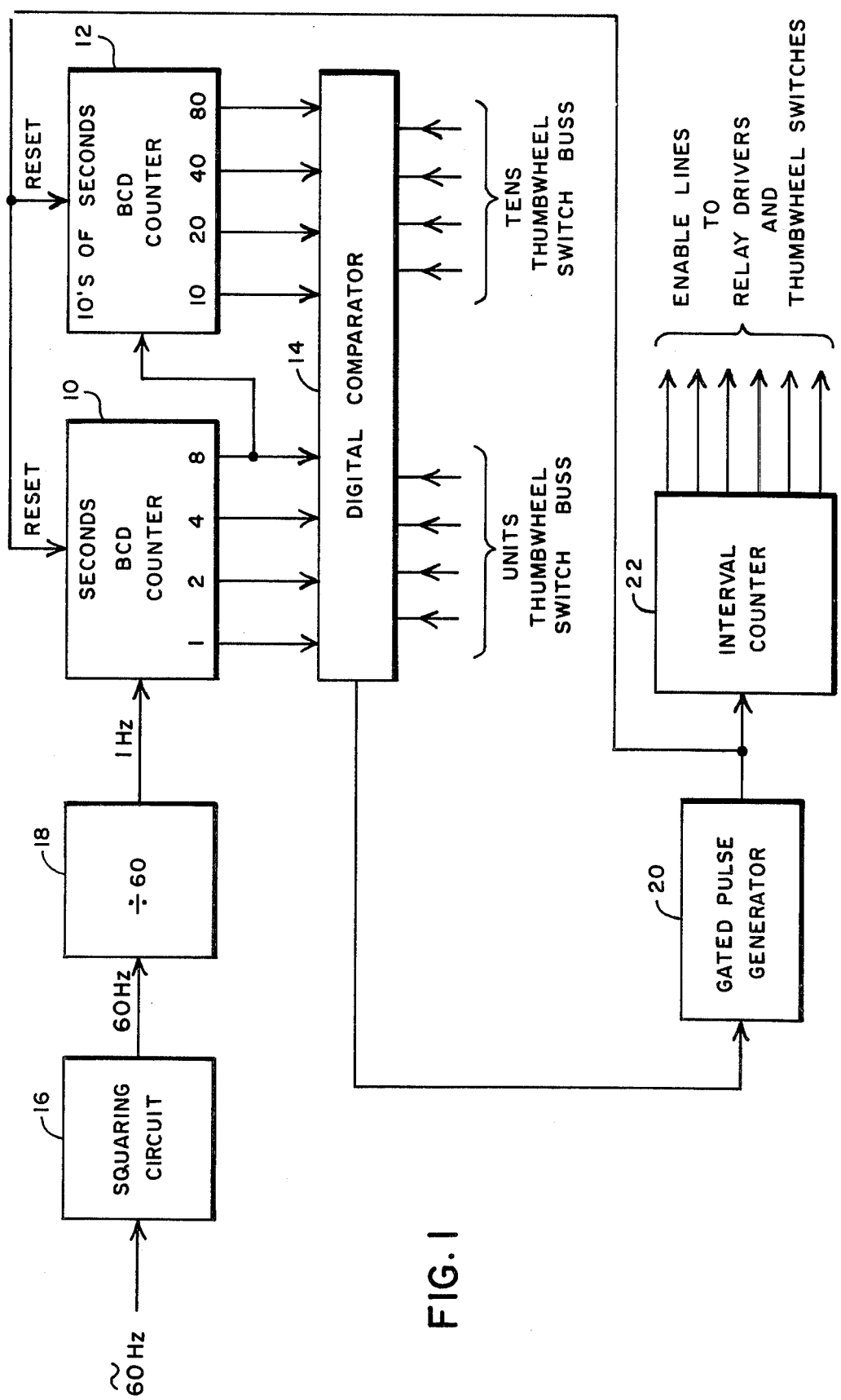
FIG. 1 is a system block diagram of a traffic controller utilizing the gated pulse generator of the present invention.

FIG. 1 shows a system block diagram of a traffic intersection controller which utilizes the gated pulse generator of the present invention. The purpose of this system is to control the timing and sequencing of traffic signals at an intersection. The length of each interval in the sequence is programmable by the operator by means of thumb wheel switches (not shown) in the controller. If the operator wishes to skip an interval altogether, the thumb wheel switches are set to zero. Each interval of the traffic signal cycle has a set of thumb wheel switches.

Initially, counters 10 and 12 are set to zero and interval No. 1 is enabled. The number selected on the thumb wheel switches for interval No. 1 is entered into digital comparator 14. A 60 Hz signal is squared by squaring circuit 16 and divided by 60 by frequency divider 18 to produce a 1 Hz signal. This 1 Hz signal advances counters 10 and 12 at a rate of one count per second. Counters 10 and 12 continue to count seconds until the number of seconds elapsed agrees with the number present in the thumb wheel switches for interval No. 1. At this time the output of digital comparator 14 changes from a logic "1" to a logic "0".

Gated pulse generator 20 emits an output pulse if its input, (the output of digital comparator 14) is "0" continuously for a predetermined time period (about 2 microseconds). If the input to gated pulse generator 20 switches to "1" even briefly during this 2 microsecond period, gated pulse generator 20 resets and no pulse is emitted. When a 2 microsecond period is satisfactorily completed, a pulse is emitted and gated pulse generator 20 resets itself. If the input is still "0", another pulse generation cycle begins.

In other words, if the digital comparator 14 output remains "0" for at least 2 microseconds, gated pulse generator 20 produces an output pulse. This output pulse advances interval counter or selector 22 and resets timing counters 10 and 12 to zero. Interval counter 22 enables the various relay drivers for the traffic signal and also advances the thumb wheel switch bus to the switches associated with interval No. 2.

If the number in interval No. 2, for example, is zero, agreement will immediately exist between counters 10 and 12 and the thumb wheel switches for interval No. 2. The output of digital comparator 14, therefore, remains at zero and another pulse generation cycle of gated pulse generator 20 ensues. Gated pulse generator 20 continues to produce output pulses every 2 microseconds so long as the output of digital comparator 14 remains "0" without interruption.

The gated pulse generator 20 of FIG. 1 includes minimum gating interval discrimination. In other words, variations in the output of digital comparator 14 due to noise or switching transients are ignored because they do not satisfy the 2 microsecond continuity requirement. Gated pulse generator 20 produces an output pulse only if the output of digital comparator 14 remains "0" for greater than 2 microseconds.

Figure 2:
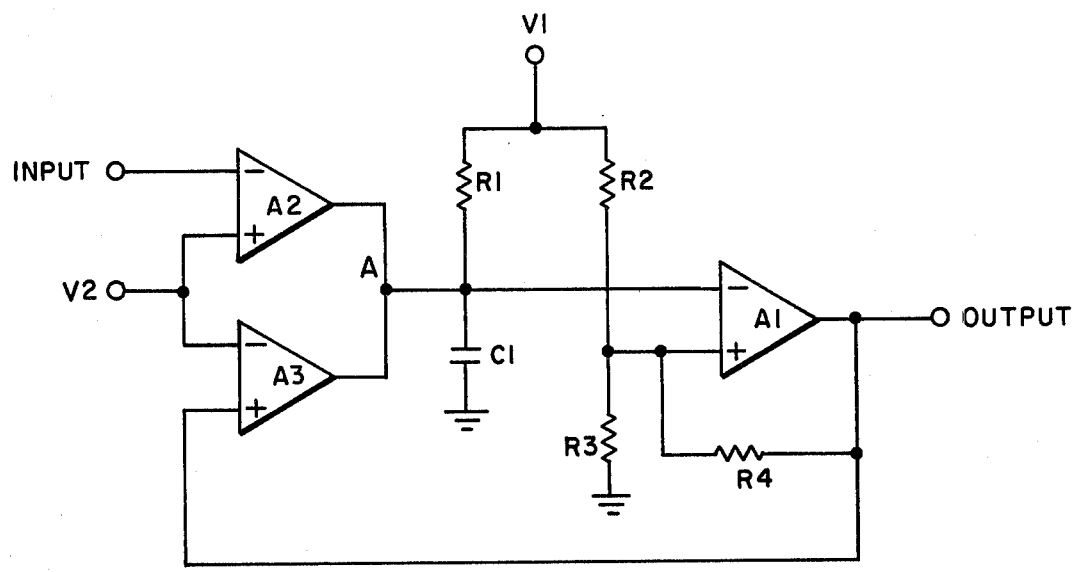
FIG. 2 shows a preferred embodiment of the gated pulse generator of the present invention.

FIG. 2 shows a preferred embodiment of the gated pulse generator of the present invention. The gated pulse generator includes first, second, and third switches A1, A2, and A3, a capacitor C1, and resistors R1-R4.

In the embodiment shown in FIG. 2, first, second and third switches A1-A3 are preferably high gain differential amplifiers with an open collector output stage. Each amplifier has an output terminal, an inverting input terminal (designated by "−") and a non-inverting input terminal (designated by "+"). If the voltage on the inverting input of any amplifier is less than the voltage present on the non-inverting input, the amplifier output is essentially an open circuit. If the voltage on the inverting input is greater than the voltage on the non-inverting input, the output transistor of the amplifier is conducting, making the output a low impedance to ground.

The input signal to the gated pulse generator (i.e. the output of digital comparator 14) is applied to the inverting input of A2. A reference potential V2 is applied to the non-inverting input of A2 and the inverting input of A3. The output of A1 provides the output signal of the gated pulse generator. In addition, the output of A1 is connected to the non-inverting input of A3.

Capacitor C1 is connected to the inverting input of A1. Resistor R1 is connected to capacitor C1 and to a source of potential V1 to provide charging of capacitor C1. The charging rate of C1 depends upon the capacitance of C1 and the resistance of R1.

The output terminals of A2 and A3 are both connected to C1 and to the inverting input of A1. A discharge path for capacitor C1 is provided, therefore, when the output of either A2 or A3 is in a low impedance state.

A voltage divider formed by R2 and R3 applies a threshold voltage to the non-inverting input of A1. In addition, feedback resistor R4 is conected between the output terminal and the non-inverting input terminal of A1.

The following Table shows components used in one successful embodiment of the gated pulse generator of FIG. 2.

TABLE 1

| | |
|---|---|
| R1 | 2.7K ohm |
| R2 | 22 K ohm |
| R3 | 33 K ohm |
| R4 | 6.4K ohm |
| C1 | .001 microfarad |
| V1 | +5 volts |
| V2 | +1.5 volts |
| A1, A2, and A3 | Motorola MC3302P Quad Comparator Integrated Circuit |

As shown in Table 1, an important advantage of the present invention is that only one inexpensive integrated circuit, 4 resistors, and a capacitor are required to perform the various functions required of the gated pulse generator.

Figure 3:
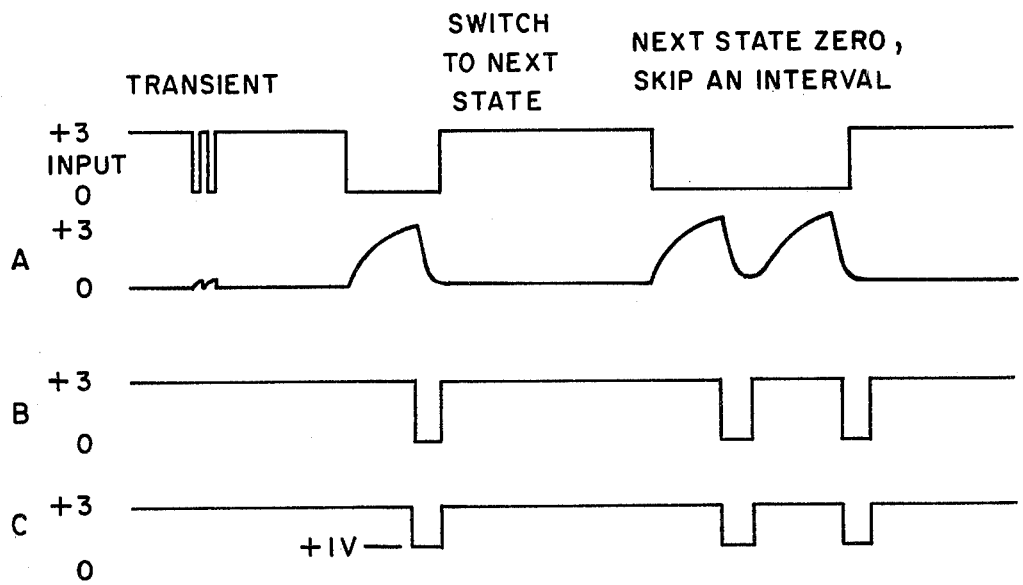
FIG. 3 is a diagram illustrating the waveforms at different points in the ciruit of FIG. 2.

FIG. 3 illustrates the waveforms at various points in the circuit of FIG. 2. Initially, the input to the gated pulse generator is "1" (about 3 volts), which causes the output of A2 to be low impedance to ground. This holds the voltage at point A at zero (waveform A) and causes amplifier A1 to be in its high output impedance state (waveform B). As a result, the non-inverting input of A1 (waveform C), the output of A1 (waveform B) and the non-inverting input of A3 are also about 3 volts.

When the output of the digital comparator 14 goes to "0", A2 switches to its high impedance state. Since A3 is already in its high impedance state, capacitor C1 begins to charge through resistor R1. If the output from the digital comparator 14 returns to "1" before capacitor C1 can charge to three volts, A2 switches back to its low impedance state and discharges capacitor C1 immediately. This is illustrated in FIG. 3 by the portin entitled "transient". If the output of the digital comparator 14 does not remain "0" for at least the time it takes capacitor C1 to charge to three volts, the output of A1 does not change state. In this manner, short duration transients on the output of digital comparator 14 are ignored by the gated pulse generator. The minimum gate interval of gated pulse generator 20, which is determined by R1 and C1, is about 2 microseconds.

If the input to A2 remains "0" for a period of at least 2 microseconds, then capacitor C1 reaches three volts. The output of A1 switches from the high impedance to the low impedance state. This output signal advances interval counter 22, resets counters 10 and 12, and switches A3 from a high impedance to a low impedance output. The switching of A3 provides a discharge path for C1. Feedback resistor R4 holds the reference or threshold voltage on the non-inverting input of A1 from three volts down to about one volt when the output of A1 goes to zero. Consequently, capacitor C1 has to discharge below one volt before A1 reverts to its high impedance output state. This hysteresis, together with the inherent delays in the amplifiers A1, A2, and A3, provides an output pulse width of about one microsecond. Since amplifier A3 is in its low impedance state during this time, the gated pulse generator is insensitive to the state of the input line during the time that the output pulse is being produced.

FIG. 3 also illustrates the situation in which an interval has been skipped. When the input initially changes from "1" to "0", capacitor C1 charges up to three volts. An output pulse is produced by A1, and A3 discharges C1. If the input remains "0", C1 begins to charge again as soon as the output pulse ends and A1 and A3 revert to their high impedance output states. As shown in FIG. 3, C1 may charge again to three volts, thereby causing another output pulse to be produced. The gated pulse generator continues to provide output pulse every 2 microseconds until the input reverts to "1".

The gated pulse generator of the present invention has several advantages. First, only one inexpensive integrated circuit is needed to perform the required functions. Second, the gated pulse generator has low power consumption. The integrated circuit used consumes less than 4 milliwatts. Third, the minimum number of components required improves reliability and requires less space than prior art devices.

Although the present invention has been described with reference to a series of preferred embodiments, workers skilled in the art will recognize that changes may be made in form and detail without departing from the spirit and scope of the invention. For example, although the gated pulse generator is particularly advantageous for traffic control systems, it is applicable to many other electronic systems as well. Although the particular switching means described in FIG. 2 were high gain differential amplifiers with an open collector output stage, other forms of switching means may be used. In addition, the polarities of voltages and the values of the various components may, of course, be changed depending upon the desired operating characteristics of the gated pulse generator.

The embodiments of the invention in which an exclusive property or right is claimed are defined as follows:

1. A gated pulse generator comprising: first switching means comprising an amplifier having an output terminal, an inverting input terminal, and a non-inverting input terminal with the output terminal switching from a first output state to a second output state when a signal at the inverting input terminal reaches a first threshold level; capacitor means connected to the inverting input terminal of the first switching means; second switching means comprising an amplifier having an output terminal, an inverting input terminal, and a non-inverting output terminal; third switching means comprising an amplifier having an output terminal, an inverting input terminal, and a non-inverting input terminal; said output terminals of said second and said third switching means connected to the capacitor means for controlling the charging of the capacitor means as a function of an input signal; a reference potential applied to the non-inverting input terminal of the second switching means and the inverting input terminal of the third switching means; said input signal being applied to the inverting input terminal of the second switching means; and the output terminal of the first switching means being connected to the non-inverting input terminal of the third switching means for causing the first switching means to switch between said output states, whereby an output pulse is provided.

2. The gated pulse generator of claim 1 and further comprising feedback resistor means connected between the output terminal of the first switching means and the non-inverting input terminal of the first switching means.

3. The gated pulse generator of claim 2 and further comprising voltage divider means for applying the threshold level to the non-inverting input terminal of the first switching means.

* * * * *